(12) United States Patent
Kangastupa et al.

(10) Patent No.: US 9,171,822 B2
(45) Date of Patent: Oct. 27, 2015

(54) METHOD OF SEALING AND CONTACTING SUBSTRATES USING LASER LIGHT AND ELECTRONICS MODULE

(75) Inventors: Jarno Kangastupa, Tampere (FI); Tiina Amberla, Tampere (FI); Kazuo Yamada, Tokorozawa (JP)

(73) Assignee: Corelase Oy, Tampere (FI)

( * ) Notice: Subject to any disclaimer, the term of this patent is extended or adjusted under 35 U.S.C. 154(b) by 182 days.

(21) Appl. No.: 13/643,306

(22) PCT Filed: May 17, 2011

(86) PCT No.: PCT/FI2011/050453
§ 371 (c)(1),
(2), (4) Date: Nov. 14, 2012

(87) PCT Pub. No.: WO2011/144813
PCT Pub. Date: Nov. 24, 2011

(65) Prior Publication Data
US 2013/0070428 A1 Mar. 21, 2013

(30) Foreign Application Priority Data
May 18, 2010 (FI) ........................................ 20105539

(51) Int. Cl.
*B23K 26/24* (2014.01)
*H01L 23/00* (2006.01)
(Continued)

(52) U.S. Cl.
CPC ............ *H01L 24/91* (2013.01); *B23K 26/0042* (2013.01); *B23K 26/246* (2013.01);
(Continued)

(58) Field of Classification Search
CPC ............. B23K 26/246; B23K 2203/04; B23K 26/3206; B23K 26/20; B23K 26/24
USPC .................. 361/803; 438/612, 615, 660–662; 156/272.8
See application file for complete search history.

(56) References Cited

U.S. PATENT DOCUMENTS 6,853,544 B2 * 2/2005 Hsu .......................... 361/679.08
2002/0136507 A1 9/2002 Musk
(Continued)

FOREIGN PATENT DOCUMENTS

DE 10235372 A1 2/2004
DE 10235372 A1 * 2/2004
(Continued)

OTHER PUBLICATIONS

Mescheder U M et al: "Local laser bonding for low temperature budget", Sensors and actuators A, Elsevier Sequoia S.A., Lausanne, CH, vol. 97-98, Apr. 1, 2002.

*Primary Examiner* — Jenny L Wagner
*Assistant Examiner* — Michael P McFadden
(74) *Attorney, Agent, or Firm* — Seppo Laine Oy (57) ABSTRACT

The invention concerns a method of fusing and electrically contacting a first insulating substrate (28A) having at least one first conductive layer (29A) thereon with at least one second insulating substrate (28B) having at least one second conductive layer (29B) thereon, the method comprising: stacking the first and second substrates (28A, 28B) such that an interface zone is formed between them, the interface zone comprising an electrical contacting zone where at least one first conductive layers (29A) faces and is at least partially aligned with at least one second conductive layer (29B), and a substrate fusing zone where the insulating substrates (28A, 28B) directly face each other; focusing to the interface zone of the substrates (28A, 28B) through one of the substrates (28A, 28B) a plurality of sequential focused laser pulses from a laser source, the pulse duration, pulse frequency and pulse power of the laser light being chosen to provide local melting the substrate (28A, 28B) materials and the conductive layers (29A, 29B); and moving the laser source and the substrate with respect to each other at a predetermined velocity and path so that a structurally modified zone is formed to the interface zone, the structurally modified zone overlapping with said electrical contacting zone and said substrate fusing zone. The invention provides a convenient way of manufacturing well-sealed joints and electrical contacts for multifunction electronic devices, for example.

10 Claims, 8 Drawing Sheets

(51) Int. Cl.
*B23K 26/00* (2014.01)
*G02F 1/1339* (2006.01)
*G02F 1/1345* (2006.01)

(52) U.S. Cl.
CPC ............ *G02F1/1339* (2013.01); *G02F 1/1345* (2013.01); *H01L 23/562* (2013.01); *H01L 24/80* (2013.01); *H01L 24/83* (2013.01); *H01L 2224/056* (2013.01); *H01L 2224/2918* (2013.01); *H01L 2224/29139* (2013.01); *H01L 2224/29144* (2013.01); *H01L 2224/29147* (2013.01); *H01L 2224/29171* (2013.01); *H01L 2224/80001* (2013.01); *H01L 2224/80224* (2013.01); *H01L 2224/80359* (2013.01); *H01L 2224/80488* (2013.01); *H01L 2224/8348* (2013.01); *H01L 2224/83193* (2013.01); *H01L 2224/83224* (2013.01); *H01L 2224/83439* (2013.01); *H01L 2224/83444* (2013.01); *H01L 2224/83447* (2013.01); *H01L 2224/83471* (2013.01); *H01L 2224/9211* (2013.01); *H01L 2924/0104* (2013.01); *H01L 2924/01005* (2013.01); *H01L 2924/01006* (2013.01); *H01L 2924/0107* (2013.01); *H01L 2924/01029* (2013.01); *H01L 2924/01033* (2013.01); *H01L 2924/01042* (2013.01); *H01L 2924/01047* (2013.01); *H01L 2924/01049* (2013.01); *H01L 2924/01059* (2013.01); *H01L 2924/01066* (2013.01); *H01L 2924/01068* (2013.01); *H01L 2924/01074* (2013.01); *H01L 2924/01075* (2013.01); *H01L 2924/01079* (2013.01); *H01L 2924/01105* (2013.01); *H01L 2924/10253* (2013.01); *H01L 2924/12044* (2013.01)

(56) References Cited

U.S. PATENT DOCUMENTS

| | | | |
|---|---|---|---|
| 2003/0197827 A1* | 10/2003 | Friedrich et al. | 349/149 |
| 2004/0082145 A1* | 4/2004 | Reichenbach et al. | 438/455 |
| 2004/0207314 A1 | 10/2004 | Aitken et al. | |
| 2005/0042838 A1* | 2/2005 | Garyainov et al. | 438/455 |
| 2005/0174042 A1* | 8/2005 | Nishikawa et al. | 313/500 |
| 2007/0232023 A1* | 10/2007 | Tong et al. | 438/455 |

FOREIGN PATENT DOCUMENTS

| | | |
|---|---|---|
| JP | 2005038891 A | 2/2005 |
| WO | WO2010139841 A1 | 12/2010 |

* cited by examiner

METHOD OF SEALING AND CONTACTING SUBSTRATES USING LASER LIGHT AND ELECTRONICS MODULE

FIELD OF THE INVENTION

The invention relates to processing substrates using laser. In particular, the invention relates to welding of glass and/or semiconductor substrates containing electrical contact areas together using pulsed laser light. The substrates may comprise e.g. sapphire, quartz or silicon.

BACKGROUND OF THE INVENTION

EP 1369912 discloses a method of bonding a flip chip to a chip carrier using laser beam. The method comprises aligning a contact area of the chip and a contact area of the chip carrier and projecting a laser beam through the chip or carrier to the aligned contact areas to electrically bond them to each other. However, the surroundings of the contact area remain exposed to ambient air (oxygen) and humidity, which may have a detrimental effect on the device being manufactured.

US 2004/207314, US 2005/174042, US 2003/197827 and JP 2005/028891 disclose further methods utilizing laser welding for contacting or joining parts of semiconductor or glass substrates. Also none of these methods, however, is capable of producing a simultaneously well-contacted and well-sealed structure.

SUMMARY OF THE INVENTION

It is an aim of the invention to achieve an improved method of electrical contacting of substrates using laser light, the method also providing protection against particles, oxygen and humidity.

It is a further aim of the invention to provide a well-sealed electronics module having electrical contacts.

The aims are achieved by the method and electronics module according to the independent claims.

The invention is based on the finding that laser light may induce both fusing of substrate materials, which are generally insulating, and conductive layers applied thereon, together by sweeping of pulsed laser light over their interface zones. A practically complete fusion (welding) of both these areas is achieved.

In one embodiment, the invention provides a method of fusing and electrically contacting a first insulating substrate, preferably a glass substrate, having at least one first conductive layer, i.e., contact terminal, thereon with at least one second insulating substrate, preferably a glass or silicon substrate, having at least one second conductive layer thereon. The method comprises stacking the first and second substrates such that an interface zone is formed between them, the interface zone comprising
    an electrical contacting zone where at least one first conductive layers faces and is at least partially aligned with at least one second conductive layer, and
    a substrate fusing zone where the insulating substrates face each other,
  focusing to the interface zone of the substrates through one of the substrates a plurality of sequential focused laser pulses from a laser source, the pulse duration, pulse frequency and pulse power of the laser light being chosen to provide local melting the substrate materials and the conductive layers,
  moving the laser source and the substrate with respect to each other at a predetermined velocity and path so that a structurally modified zone is formed to the interface zone, the structurally modified zone overlapping with said electrical contacting zone and said substrate fusing zone.

The term "insulating substrate" refers to all non-conductive substrates, including intrinsic semiconducting substrates, which are frequently used as wafers in microelectronics. The conductive layer is typically a metal layer.

The invention provides significant advantages. First, as the mechanical and electrical connecting of the substrates is carried out in the same processing stage, the method is simple and provides both time and cost savings. Second, the weld seam can be made completely hermetic because of direct fusion of materials. Third, the same laser exposure scheme can be used for purely mechanical or electrical connecting of other substrates or components in the same electrical device. Fourth, a very high-quality and pinhole-free weld seam can be produced.

According to one embodiment, at least one of the substrate bodies is transparent for the laser wavelength used. This allows for the laser to be guided through the substrate and focused to the interface, where the intensity per volume is high enough to achieve heating and welding of the substrates or their contact areas.

One aim of the invention is to produce laser-induced welding and electrical contacting of substrates, in which the weld seam produced is higher quality, that is, essentially free of microcracks. This is achieved, in particular, by using picosecond-scale laser pulses which induce at the substrate, in addition to nonlinear absorption, also considerable linear absorption effect, provided that they are directed to the substrate temporally and spatially frequently enough. Therefore, a subsequent pulse is directed to the substrate such that it significantly overlaps with the spot of the previous pulse, the spot still being hot enough, additional absorption of laser energy to the substrate is gained due to linear absorption. In addition to increased absorption, a high pulse repetition rate will reduce microcracking susceptibility of the substrate material(s). This is because a preceding pulse can make the material less rigid and when the succeeding pulse comes the shock wave will be dampened.

An apparatus can be used which comprises
  a pulsed laser source for emitting laser pulses having a predefined duration, pulsing frequency and focal spot diameter,
  means for holding the substrates such that laser light can be guided from the pulsed laser source to the interface zone of the substrates through one of the substrates,
  means for moving the substrates with respect to the pulsed laser source with a predefined velocity and along a predefined path.

Alternatively, the laser beam can be guided using mirror optics, for example, to avoid movement of the laser source and/or the substrates.

The effective optical distance between the laser source and the substrate is arranged to be such that the laser pulses are focused to the interface zone of the substrates. This means that enough energy to locally melt the substrate material(s) is absorbed from each individual pulse to both substrates.

The method according to the invention has found to yield processed substrates having low amount of microcracks within the processed materials and thus high bending strength of processed components.

In this document, the term "substrate" means broadly any target material or material combination in which structural changes (melting and re-solidification) take place upon proper pulsed laser exposure. The substrate may be substantially homogeneous or it may comprise a plurality of regions or layers made from different materials. The regions or layers may initially be connected. The processing may be directed to one individual layer or region or to the interface of two or more layers or regions, depending on the desired effect.

Further embodiments and advantages of the invention are described in the following detailed description with reference to the attached drawings.

DETAILED DESCRIPTION OF EMBODIMENTS

Figure 1:
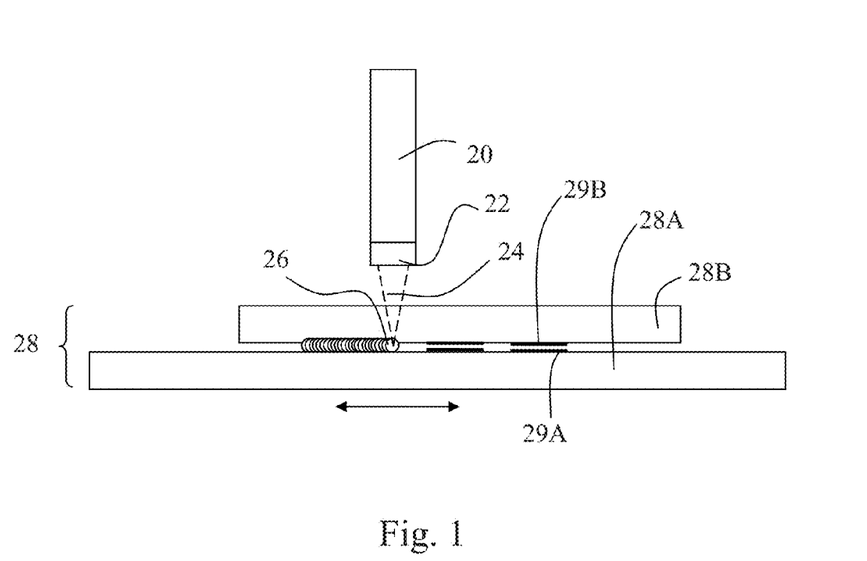
FIG. 1 shows a side view of the welding process according to one embodiment of the invention.
Figure 2:
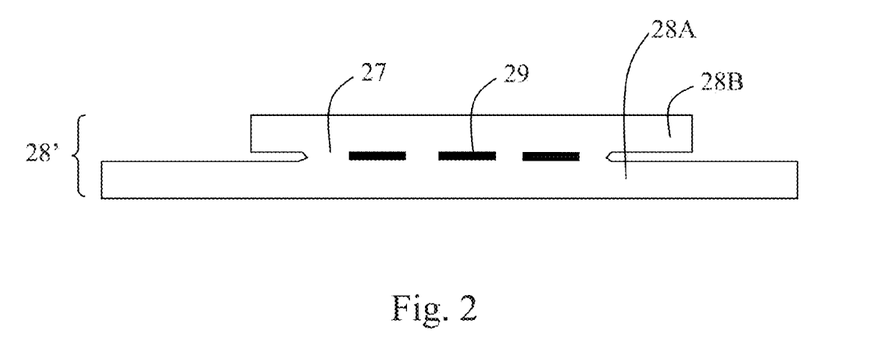
FIG. 2 illustrates a side view welded product resulting from the process of shown in FIG. 1.

FIG. 1 shows one way of carrying out the present method. There is provided a first substrate 28A (e.g. a glass substrate), which contains first electrical contact terminals 29A, and a second substrate 28B (e.g. a semiconductor chip), which contains second electrical contact terminals 29B. The substrates 28A, 28B are placed on top of each other as a stack 28 such that the contact terminals 29A, 29B are aligned with each other at their interface zone. Thereafter, a laser source 20 is used to produce, through optics 22, a pulsed laser beam 24, which is focused through one of the substrates to the interface zone so as to produce a plurality of sequential and overlapping laser-induced spots to the interface zone. As shown in FIG. 2, after the process, the stack 28 has transformed into a fused stack 28' in which the substrates 28A, 28B have fully fused together at the regions 27 with no contact terminals 29A, 29B. At the region of the contact terminals 29A, 29B, the contact terminals have fully fused together so as to provide electrical connection zones 29 between the substrates.

Figure 3A:
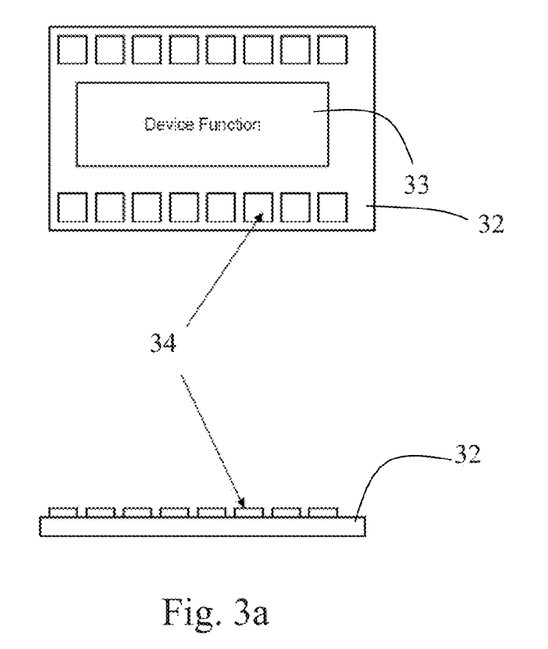
FIGS. 3a-3c show a top and side views of a) a microcircuit, b) a glass substrate and c) electronics module comprising the components of a) and b) fused and electrically connected according to the invention.
Figure 3B:
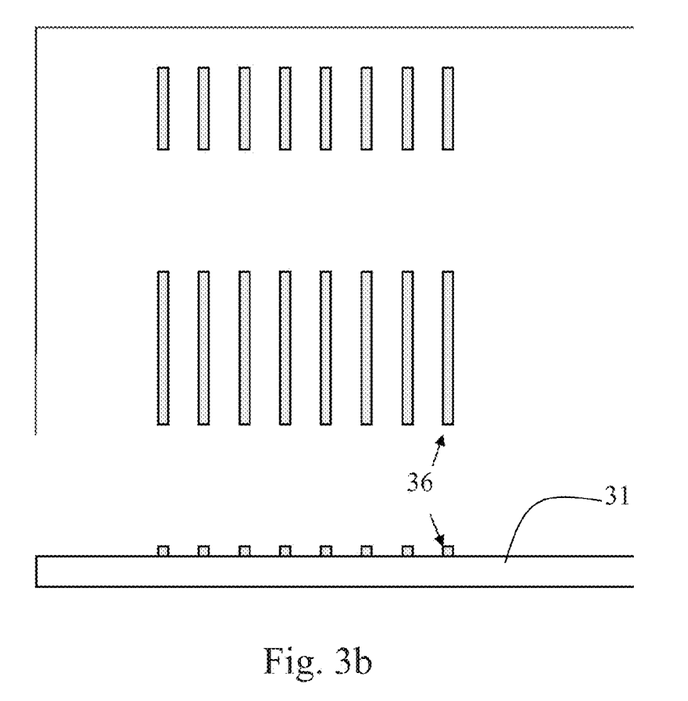
Figure 3C:
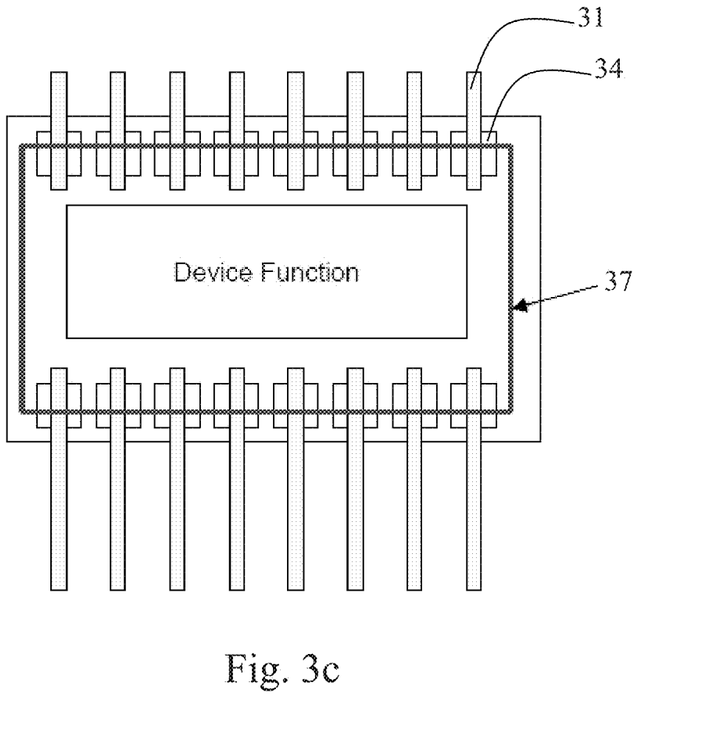

FIG. 3a shows a microchip comprising a substrate 32 comprising a electronic function portion 33 and a plurality of contact terminals 34. FIG. 3b shows a substrate 31 comprising contact terminals 36 which are adapted to mate with contact terminals 34 of the microchip when stacked. FIG. 3c shows the microchip and the substrate in stacked configuration and a weld line 37 provided between the elements using the method of the invention. The weld line overlaps with the contact terminals 31, 34 facing each other and also areas outside the contact terminals and, in this case, forms a closed loop. Thus, a hermetic protection for the core of the microchip is achieved against outside moisture and oxygen diffusing between the substrates.

Figure 3D:
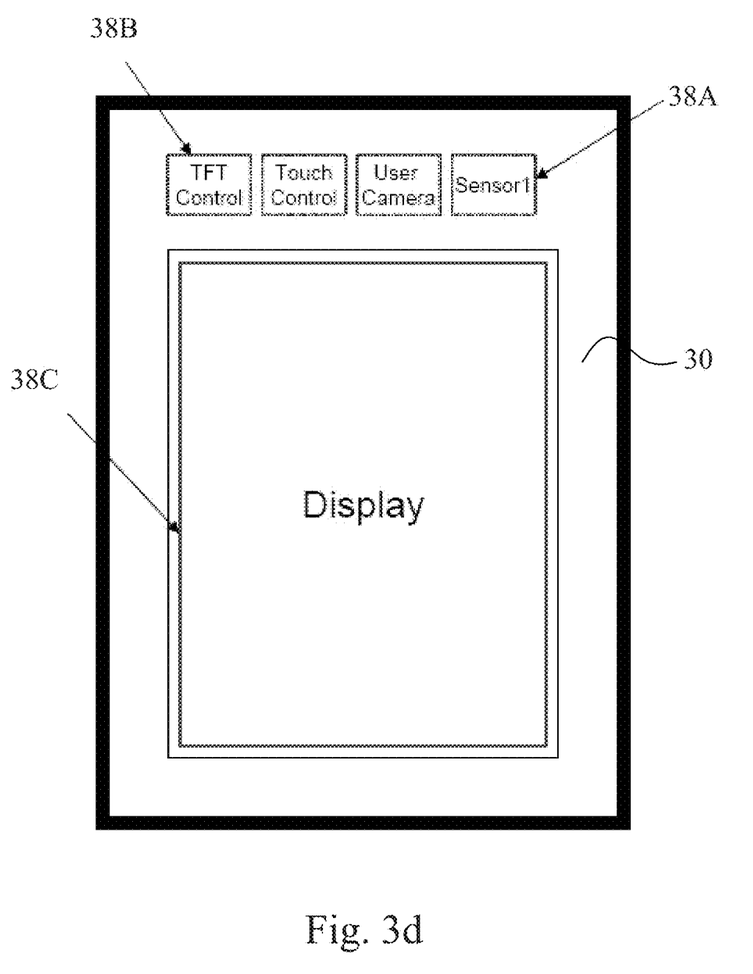
FIG. 3d shows a top view of a multifunction electronics module manufactured with the aid of the invention.

FIG. 3d shows a multifunction device comprising a substrate 30 onto which a plurality of functional components are affixed using the present method. It should be noted that not all the components need to contain both types effusing zones (direct substrate fusion and electrical contacting zones). For example, a moisture-sensitive sensor may be sealed and contacted with the larger substrate using the present method, but a display element may only be sealed to the larger substrate without contacting (which is carried out by some other means). If hermeticity is not required, only electrical contacting may be carried out. It is an advantage of the invention that the same laser exposure scheme can be used for each of these cases, whereby manufacturing of such multifunction devices is simplified.

In particular, the invention is particularly usable for welding glass and/or semiconductor substrates, such as silicon, technical glasses such as quartz, fused silica, borosilicate, lime glass, temperature expansion co-efficient tuned glasses, sapphire, ceramics such as zirconium oxide, LiTaO etc. and combinations of these materials. The substrates may contain conductive zones made of chrome, copper, gold, silver, molybdenum or indium-tin-oxide (ITO), for example.

Particularly preferred material combinations (substrate 1/conductive material 1-conductive material 2/substrate 2) which can be welded using the present method are:
glass/chrome-chrome/glass
glass/copper-copper/glass
glass/copper-copper/silicon
glass/gold-gold/glass
glass/gold-gold/silicon
glass/silver-silver/silicon
glass/molybdenum-molybdenum/glass
glass ITO-ITO glass The laser light is typically directed through a glass substrate. The thickness of the substrate the laser pulses are directed though is typically 100-500 µm. The thickness of the lower substrate is irrelevant, but at least thicknesses of 300-1000 µm can be processed successfully. The thicknesses of the metallizations on the substrates are typically 0.1-5 µm, in particular 0.1-3 µm.

According to one embodiment, a pulse duration of 20-100 ps and the pulsing frequency and the moving velocity adjusted such that the pulses significantly overlap, the distance between successive pulses being less than $\frac{1}{5}$ of the diameter of the focal spot. The pulsing frequency is preferably at least 1 MHz. In this parameter range, it has been found that both nonlinear and linear absorption of laser power will be most efficiently utilized, resulting in higher total absorptivity than in known methods. Thus, the target spot is still hot because of the previous pulse at the time of arrival of the subsequent pulse, the material is locally not transparent to the wavelength used but has already initially significant absorptivity, ie. high number of free charge carriers. In other words, because of the previous pulses, the number or electrons in the conduction band is very high and the material appears as metal-like target having high absorptivity for the laser radiation. In typical applications, the focal spot diameter is in the range of 1-10 µm, resulting in a typical maximum distance between pulses the range of 200 nm-2 µm. A more detailed description of the physical phenomena occurring in the substrate is given in our earlier PCT application No PCT/FI2009/050474.

An additional advantage of the described processing scheme is that lower peak power of laser light (typically less than $10^{12}$ W/cm$^2$) can be utilized, the average power still being higher or at least at the same level as in known methods. Thus, a laser-induced shock wave cause by each individual pulse is followed by a significant thermal wave contributed by subsequent pulses directed to the immediate vicinity of the impact zone of the pulse. One benefit of this is that local cracks caused by individual pulses are automatically repaired as the melting effect in the vicinity is high. Thus, the structurally modified zone resulting from the processing according to the invention is consistent and of high quality. Typically, the peak power used is $10^{10}$-$10^{12}$ W/cm$^2$, in particular $10^{10}$-$5*10^{11}$ W/cm$^2$. This is significantly less than that is required in femtosecond pulse processing or multiphoton absorption processing methods and has the consequence that the number of laser-induced defects is greatly reduced.

According to one embodiment, the pulsing frequency is increased or the moving velocity is decreased such that the distance between successive structurally modified spots is less than $1/10$, preferably less than $1/20$ of the diameter of said focal spot. This further increases the linear absorption effect taking place in the substrate and aids in achieving a more homogeneous processing line. The processing frequency is preferably at least 4 MHz and it may be up to 20 MHz and even more.

In the metallized areas, the electrons of the metal foil cause the linear absorption effect to increase, compared with areas having no metallizations. There is formed a plasma cloud whose electrons increase absorption of light not strictly in the metallized areas but also in the glass or semiconductor substrate in its vicinity.

Figure 5A:
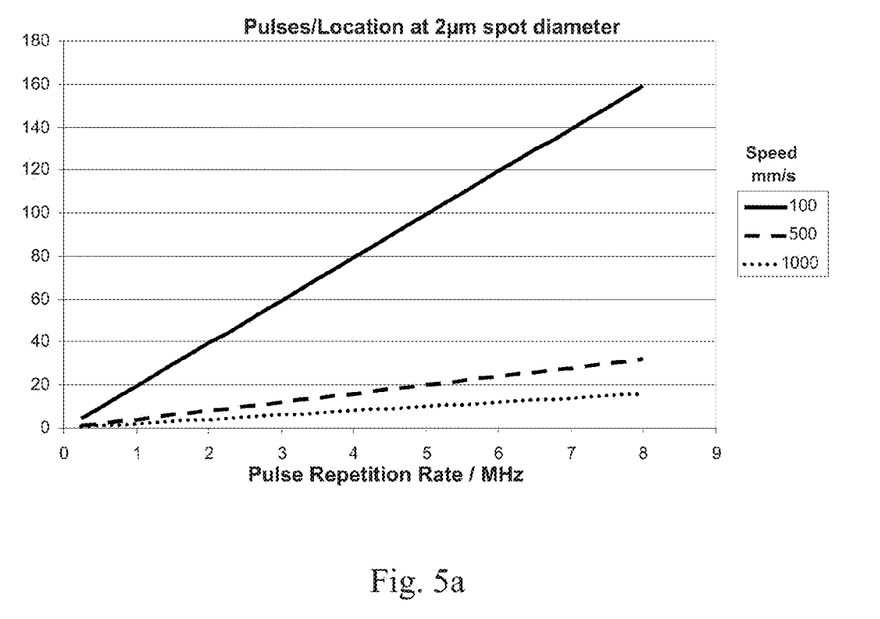
FIGS. 5a and 5b show diagrams of laser pulses at each location as a function of frequency for two different focal spot diameters.
Figure 5B:
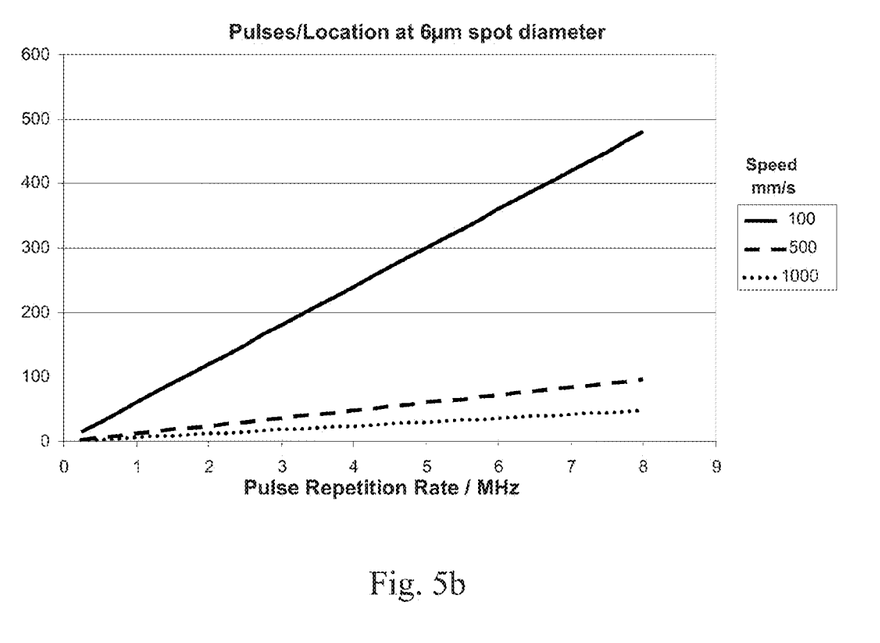

Generally, the percentage of overlap of successive pulses can be characterized by the formula (1−(processing speed* (time between pulses)/focal spot diameter)). FIGS. 5a and 5b show the number of pulses hitting each location of the substrate calculated with the aid of this formula for 2 μm and 6 μm spot diameters, respectively, and for three exemplary processing speeds, as a function of processing frequency.

The preferred pulsing parameter ranges disclosed above can be used for processing substrates which are in their normal state totally or partly transparent at the wavelength used. This is because in practice impurities or lattice defects of the material initiate the photoionization process and further the impact ionization process. It is to be noted that so-called multiphoton absorption, which plays a key role in processing substrates by shorter pulses, in particular by femtosecond-scale pulses, does not significantly take place and is not even necessary.

According to a preferred embodiment, the wavelength used is in the near infrared range, i.e. 0.75-1.4 μm. This range has been proven to be suitable not only for silicon processing, but also for high band gap materials such sapphire and quartz, which are difficult to process at least in any industrial way using known low-frequency and/or femtosecond-scale processing methods.

According to one embodiment nonpolarized laser light is used. This causes the electromagnetic field direction in the substrate to be arbitrary and makes the method more immune of the lattice parameters of the substrate. In other words, nonpolarized light has been found to be effective for a wider variety of substrates.

Figure 6:
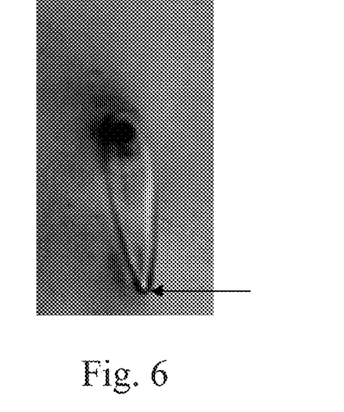
FIG. 6 shows a cross-sectional image of a microstructure processed according to the invention to a glass substrate.

FIG. 6 shows a cross-sectional image of a microstructure processed according to the invention to a glass substrate. The laser has been directed to the substrate from above and the melting process has initiated at the tapered end (see arrow) of the feature shown. It can be seen that a pulse having a duration of 20 ps or more provides a round shape at the initiation point, contrary to shorter pulses, in particular sub-ps pulses, having sharp initiation points and high cracking probabilities in the vicinity of the initiation point. It can also be seen that the diameter of the resulting feature in glass is so wide that power density is not enough for multiphoton absorption and that the linear absorption effect strengthens towards the upper portion of the feature.

Figure 7:
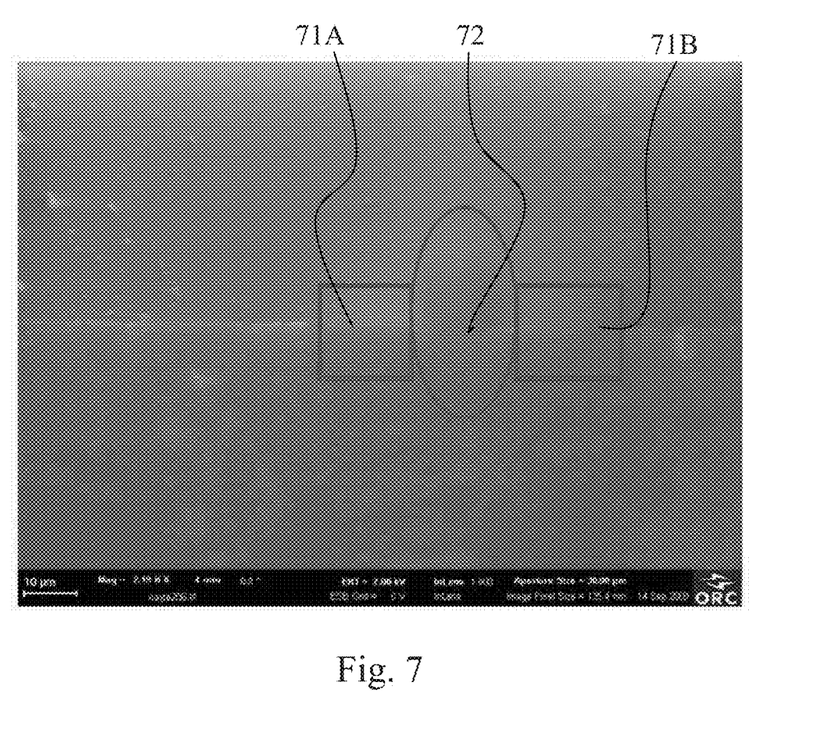
FIG. 7 shows cross-sectional image of an interface produced with the aid of the invention.

FIG. 7 shows cross-sectional image of an interface produced with the aid of the invention, the interface which comprises a substrate fusing region 72 where the substrates are fully fused with each other and electrical connecting regions 71A, 71B on lateral sides of the substrate fusing region, where electrically conducting metal layers (not clearly visible) are fully fused with each other. It can be seen that in die substrate fusing region 72 the structural modification extends several micrometers to each substrate and the fusion is very through (hermetic), In this region, the connection between the substrates may be characterized as 'diffused deep bonding'. On the other hand, in the electrical connecting regions 71A and 71B the depth of the structural modification is smaller due to more local absorption of laser energy due to the metal-containing layers, i.e. 'surface bonding'.

According to a preferred embodiment, the laser source used is a fiber laser source. Fiber lasers have the advantage that they are capable of producing light at the megahertz frequency range, which has been found to be the most interesting as regards both processing speed and quality, as discussed above. Fiber lasers in this context mean lasers in which the active gain medium is a doped optical fiber. The doping can be achieved with rare-earth elements such as erbium, ytterbium, neodymium, dysprosium, praseodymium, and thulium.

The present invention has the advantage that very high processing speeds can be achieved in welding due to the absence of a separate contacting stage. In addition, the weld seam can be manufactured hermetically sealed and of very high quality.

The invention can be used for welding silicon crystal wafers and other semiconductor materials used in the fabrication of integrated circuits and other microdevices. Such wafers contain microelectronic device(s) built in and/or over the wafer by any known microfabrication process such as doping, ion implantation, etching, deposition, and photolithographic patterning and electronic terminals for conducting electronic current and/or potential to the device(s).

Particular advantages are achieved with very thin wafers (e.g. <200 μm, in particular <100 μm), which are used, for example, for manufacturing display panels (e.g. LCD panels and (O)LED panels). However, the invention can in principle be used for wafers of any thicknesses.

According to one embodiment, the invention is used for welding at least two superimposed layers having an interface zone, the method comprising focusing the laser pulses to said interface zone for achieving local melting at the interface zone and for welding the layers together through re-solidification.

The welding application is schematically illustrated in FIG. 2. In the method, a laser source 20 and optics 22 are used for producing and focusing a laser light beam 24 to the interface of two separate layers 28A and 28B of a substrate 28. The plurality of overlapping pulses subjected to a moving substrate give rise to a weld seam 26 connecting the layers 28A and 28B according to the principle described above.

Figure 4A:
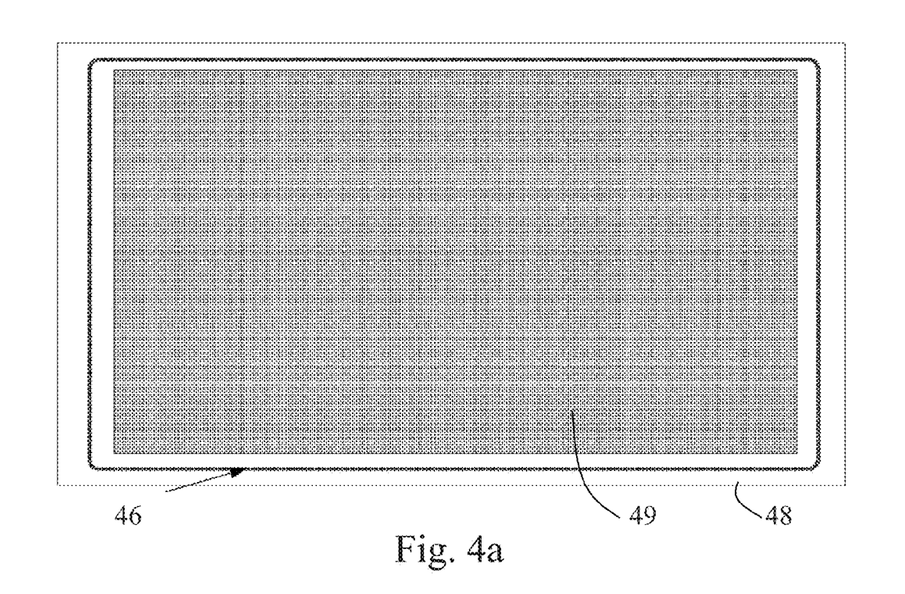
FIGS. 4a-4d illustrate welding of an (O)LED display panel according to one embodiment of the invention.
Figure 4B:
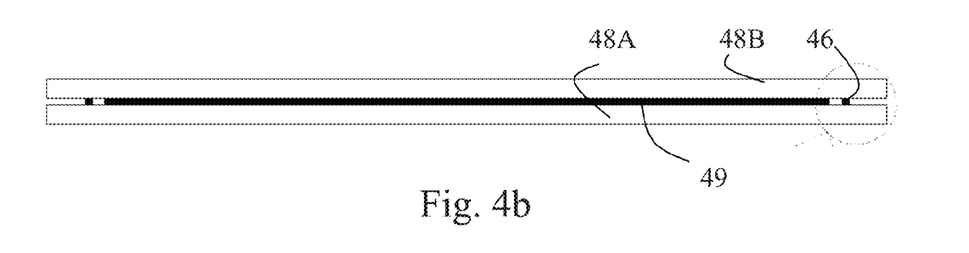

According to one example, the substrate comprises two superimposed glass panels which are welded together at the fringe areas of at least one of the panels by a contiguous seam. Thus, for example display panels or light sensing panels can be manufactured using the present method. FIGS. 4a and 4b show an example of manufacturing an OLED display panel. The panel 48 comprises a base layer 48A comprising an active layer 49 having an array of individual light-emitting units and a front glass layer 48B. Initially, the layers 48A and 48B are placed on top of each other such that the active layer 49, which needs to be hermetically protected, remains between them. After that, the present invention is used for producing a welded seam 46 around the whole active layer. Preferably, the welded seam is unbroken (contiguous). Thus, an effective barrier against dust and humidity can be formed for the active layer, at the same time efficiently affixing the layers of the panel together without any additional components, such as adhesives. Due to the frequent pulsing and complete melting and re-solidification of the glass layers, the seam is very impermeable. Preferably, electrical contacting of the panels 48A, 48B can be carried out at the same time as discussed above.

Figure 4C:
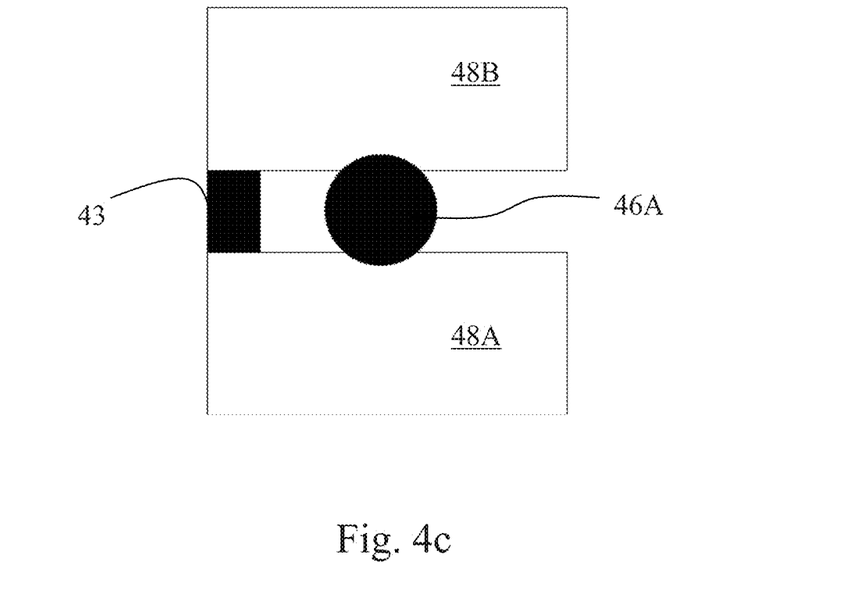
Figure 4D:
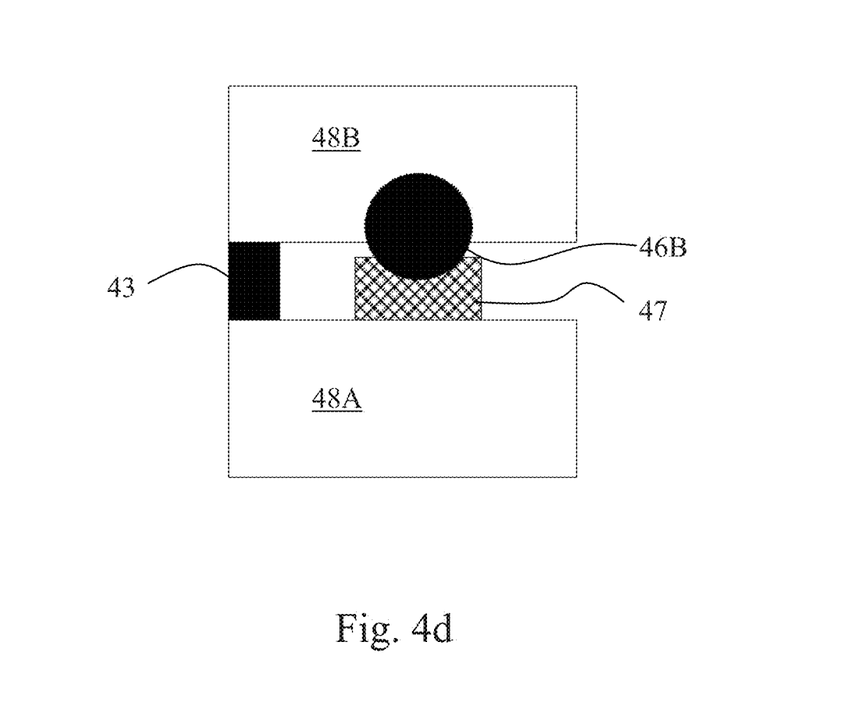

FIGS. 4c and 4d show alternative detailed views concerning two alternatives of carrying out the substrate welding. In the process of FIG. 4c, the glass layer 48A and 48B are spaced from each other at the interface zone and a weld seam 46A is produced directly between them. In the process of FIG. 4d, an additional bridging layer 47 is provided between the glass layers 48A and 48B. The bridging layer 47 decreases the free distance between the glasses and ensures that compete unification of the layers takes place. The weld seam 46B is thus produced between the bridging layer and the front glass 48B. The bridging layer 47 can be a metal layer. There may also be bridging metal layers on both substrates, whereby the welding comprises fusing the metal layers together.

In addition to manufacturing display panels, the present welding method can be used for fusing any other laser-weldable components and substrates too in applications requiring both hermetic sealing and electrical contacting. Such needs may arise e.g. in bonding microsensors and other microcomponents to substrates, wafer level packaging applications, temperature sensitive component packaging, integration of optical components and integration of microfluidistic components.

The above-described embodiments and examples and the attached drawings are given for illustrative purposes and are intended to be non-limiting. The scope of the invention is defined in the following claims which are to be interpreted in their full breadth and taking equivalents into account.

The invention claimed is:

1. A method of fusing and electrically contacting a first insulating substrate having at least one first conductive layer thereon with at least one second insulating substrate having at least one second conductive layer thereon, the method comprising
stacking the first and second substrates such that an interface zone is formed between them, the interface zone comprising
an electrical contacting zone where at least one first conductive layers faces and is at least partially aligned with at least one second conductive layer, and
a substrate fusing zone where the insulating substrates directly face each other,
focusing to the interface zone of the substrates through one of the substrates a plurality of sequential focused laser pulses from a laser source, the pulse duration, pulse frequency and pulse power of the laser light being chosen to provide local melting the substrate materials and the conductive layers,
moving the laser source and the substrate with respect to each other at a predetermined velocity and path so that a structurally modified zone is formed to the interface zone, the structurally modified zone overlapping with said electrical contacting zone and said substrate fusing zone, and
wherein the pulse duration is 20-100 ps, the pulse frequency is at least 1 MHz, and the moving velocity of the pulsed laser is adjusted such that successive pulses overlap with each other.

2. The method according to claim 1, wherein the structurally modified zone comprises a continuous hermetically sealed weld seam.

3. The method according to claim 1, wherein the path of the pulsed laser light forms a closed loop around a moisture- or oxygen-sensitive element contained in one of said substrates.

4. The method according to claim 1, wherein at least one of the substrates comprises a microchip or a display panel having a plurality of contact terminals as said conductive layers.

5. The method according to claim 1, wherein at least one of the insulating substrates comprises a glass panel.

6. The method according to claim 5, comprising focusing said laser light to the interface zone through said glass panel.

7. The method according to claim 1, wherein at least one of the substrates comprises a silicon microchip, the second contacting layers forming the contact terminals of the silicon microchip.

8. The method according to claim 1, wherein a complete local fusion of the first and second substrates together is produced as said structurally modified zone at the substrate fusing zone and a complete local fusion of the first and second conductive layers together at the electrical contacting zone.

9. The method according to claim 1, wherein the distance between successive pulses is less than ⅕ of the diameter of the focal spot of the pulses.

10. The method according to claim 1, wherein the thickness of the conductive layers is less than 1 μm.

* * * * *